United States Patent
Park et al.

(10) Patent No.: US 7,342,643 B2
(45) Date of Patent: Mar. 11, 2008

(54) METHOD OF ALIGNING WAFER USING DATABASE CONSTRUCTED OF ALIGNMENT DATA IN A PHOTOLITHOGRAPHY PROCESS

(75) Inventors: Kyoung-shin Park, Suwon-si (KR); Jong-hwa Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/283,967

(22) Filed: Nov. 22, 2005

(65) Prior Publication Data

US 2006/0206279 A1    Sep. 14, 2006

(30) Foreign Application Priority Data

Nov. 22, 2004  (KR) .................... 10-2004-0095890

(51) Int. Cl.
  *G03B 27/52*  (2006.01)
  *G03B 27/68*  (2006.01)
(52) U.S. Cl. ......................................... 355/55; 355/52
(58) Field of Classification Search ............... 355/55, 355/52, 53; 356/399–401
   See application file for complete search history.

(56) References Cited

U.S. PATENT DOCUMENTS 6,686,107 B2*  2/2004  Matsumoto et al. .......... 430/22
2005/0137837 A1*  6/2005  Oishi et al. .................... 703/1

FOREIGN PATENT DOCUMENTS

| JP | 07-302754 | 11/1995 |
|---|---|---|
| KR | 1020030009001 A | 1/2003 |
| KR | 1020030045316 A | 6/2003 |

* cited by examiner

*Primary Examiner*—Diane I. Lee
*Assistant Examiner*—Chia-how Michael Liu
(74) *Attorney, Agent, or Firm*—Volentine & Whitt, PLLC

(57) ABSTRACT

The aligning of a wafer with a reticle in photolithographic equipment is carried out using a feed forward method. In the method, a wafer is loaded onto an exposure apparatus, the wafer is aligned with a reticle, the state of alignment is measured, alignment data representative of the state of alignment is produced, and a database is searched for an alignment data type under which the alignment data falls. The database may also be searched for overlay data related to the alignment data. A correction value matched to the alignment data type is obtained. The correction value maybe calculated from the overlay data. The alignment of the wafer is corrected by applying the correction value to the alignment data. Finally, the aligned wafer is exposed.

9 Claims, 4 Drawing Sheets

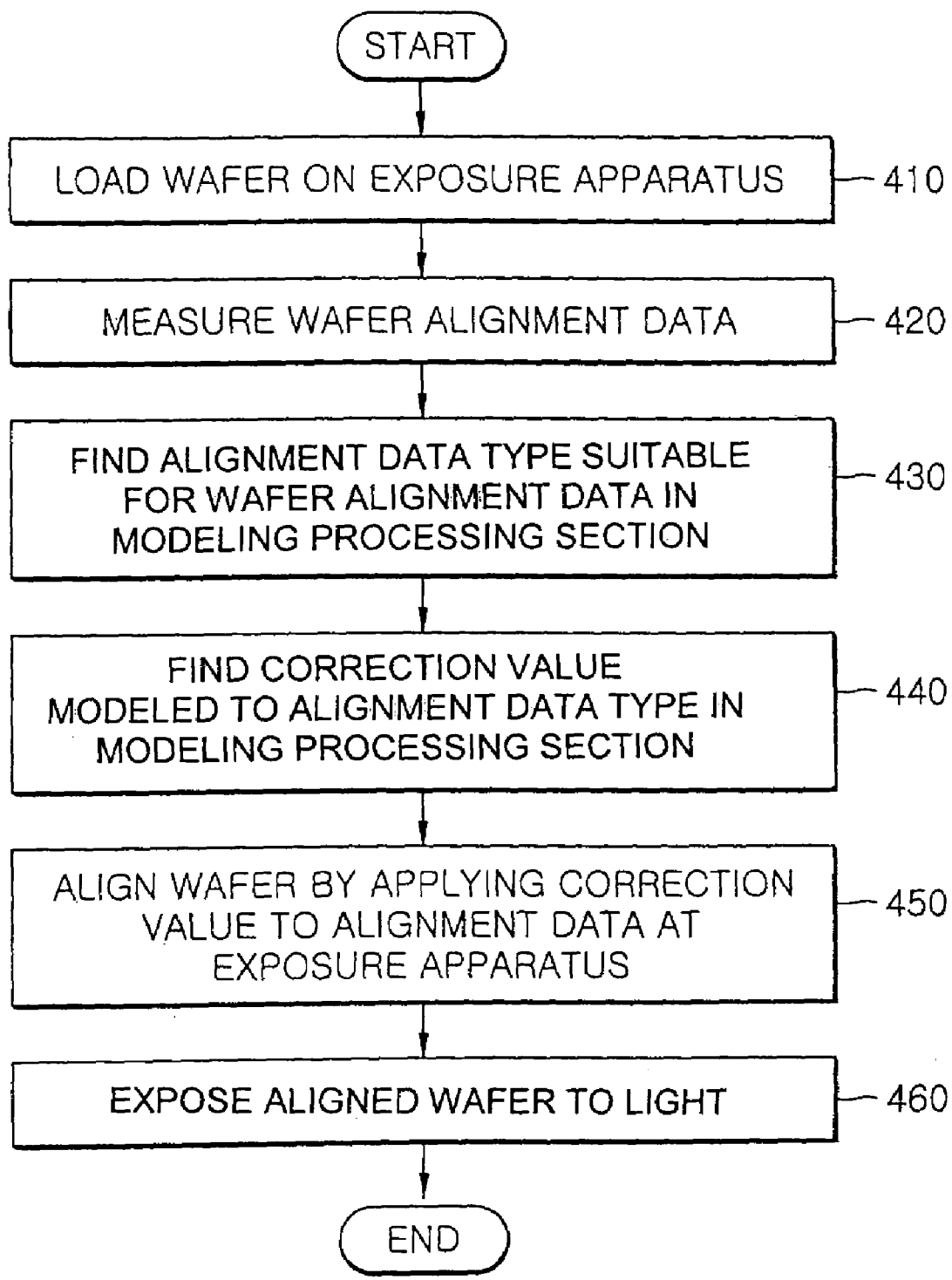

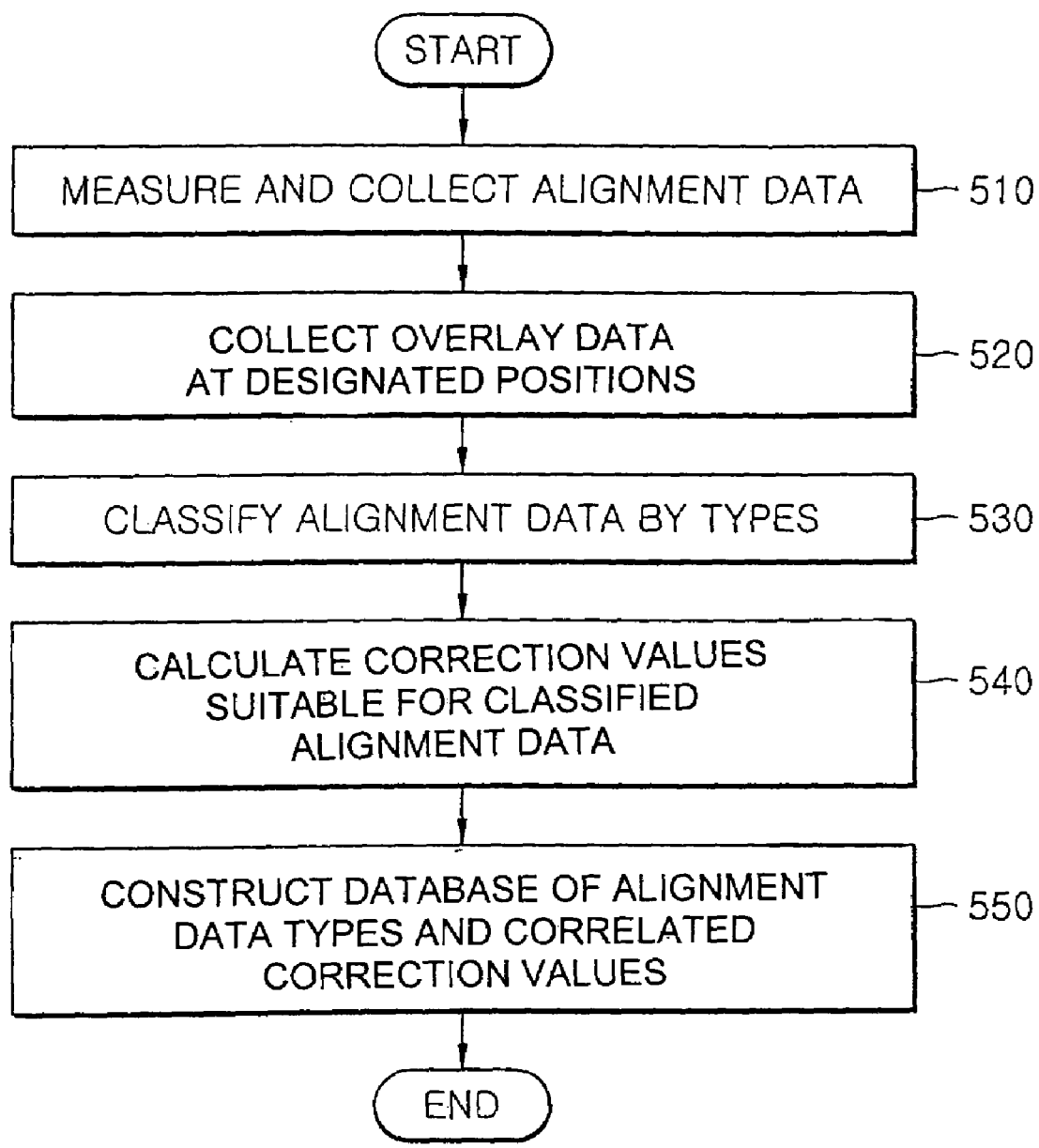

METHOD OF ALIGNING WAFER USING DATABASE CONSTRUCTED OF ALIGNMENT DATA IN A PHOTOLITHOGRAPHY PROCESS

BACKGROUND OF THE INVENTION

1. Field of the Invention

The present invention relates to photolithography. More particularly, the present invention relates to a method of aligning a wafer in photolithographic exposure equipment.

2. Description of the Related Art

Photolithography is a technique used for transcribing patterns onto a wafer. In photolithography, an alignment process is first performed to align a wafer with exposure equipment. More specifically, the exposure equipment includes a reticle bearing a pattern that is to be transferred to the wafer. The alignment process is for aligning a pattern that has already been formed on the wafer with the pattern of the reticle. The alignment process is carried out using an alignment mark formed on the wafer. Subsequently, an exposure process is carried out in which the wafer is exposed to light directed through the reticle such that an image corresponding to the pattern of the reticle is transferred to the wafer.

However, despite the alignment process, an overlay error or a misalignment error may occur between the image transferred to the wafer and a pattern already formed on the wafer. To prevent such errors from re-occurring, an overlay measurement process is performed after the exposure process to generate overlay data representative of the degree of mis-alignment between the wafer and the reticle. Then, an error correction value is produced from the overlay data, and the error correction value is fed back to the exposure equipment for use in controlling the next alignment process. That is, the alignment data used to control the alignment process is updated with feedback from the overlay measurement process.

FIG. 1 is a schematic diagram of the feedback relationship between an alignment apparatus and an overlay measurement apparatus in conventional exposure equipment.

Referring to FIG. 1, an exposure apparatus 10 performs an alignment and alignment modeling process 11 for aligning a wafer loaded thereon and modeling the alignment, and then performs an actual exposure process 13 on the aligned wafer. After the exposed wafer is unloaded from the exposure apparatus 10, the wafer is loaded on an overlay measurement apparatus 20, and the overlay measurement apparatus 20 performs an overlay measurement and overlay modeling process 21 for the wafer. The overlay measurement results (correction value) are fed back to the exposure apparatus 10 for use in correcting the wafer alignment process. The overlay modeling process calculates the correction value on the basis of the measured overlay data. The alignment modeling process is for applying the feedback correction value to the alignment data used to control the alignment process.

Such overlay and alignment modeling processes accompanying the overlay measurement and alignment processes are performed after each time a wafer is exposed. Accordingly, a great deal of time is required to manufacture semiconductor devices or the like using the conventional photolithography process.

SUMMARY OF THE INVENTION

Accordingly, an object of the present invention is to provide a method of minimizing the time required for photolithography.

According to an aspect of the present invention, there is provided a wafer alignment method in which data from a wafer alignment process is fed forward. In the method, a wafer is loaded onto an exposure apparatus, the wafer is aligned with a reticle, alignment data representative of the state of alignment between the wafer and the reticle is produced, and a database is searched for an alignment data type into which the alignment data is classifiable. Subsequently, a correction value associated with the alignment data type is obtained. The correction value is applied to the alignment data to produce corrected alignment data, and the wafer and reticle are re-aligned using the corrected alignment data. Subsequently, the wafer is exposed to light directed through the reticle.

According to another aspect of the present invention, the correction values obtained using the database are calculated from overlay data collected along with the alignment data. In this case, the database may be constructed by collecting alignment data for various samples, collecting overlay data along with the alignment data for each of the samples, and classifying the collected alignment data into a plurality of alignment data types so that collected overlay data is associated with each of the alignment data types. The collected alignment data is representative of states of alignment between a wafer and a reticle for the samples. Also, for each of the samples, the overlay data is characteristic of the overlaying of images on the wafer after the wafer is exposed while in the state of alignment used in the collecting of the alignment data for the sample.

According to yet another aspect of the present invention, the accuracy of the database may be periodically verified through a discrete overlay measurement process. For example, the overlay measurement process may be performed once on every given number of exposed wafers.

BRIEF DESCRIPTION OF THE DRAWINGS

The above and other objects, features and advantages of the present invention will become more apparent from the following detailed description of the preferred embodiments thereof made with reference to the attached drawings in which:

FIG. 4 is a flowchart of the alignment method according to the present invention; and FIG. 5 is a flowchart of a method of generating a database that can be used in the alignment method according to the present invention.

DETAILED DESCRIPTION OF THE PREFERRED EMBODIMENTS

A method of aligning wafers in photolithographic equipment according to the present invention will now be described in detail with reference to FIGS. 2-5.

Figure 1:
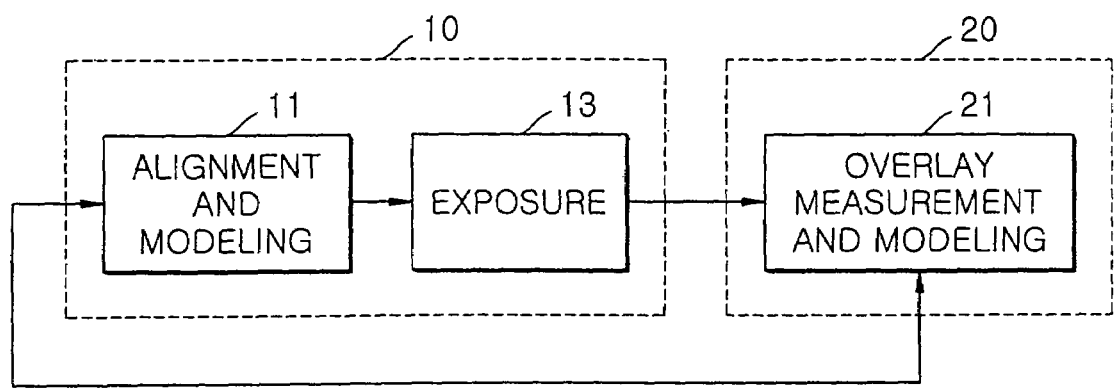
FIG. 1 is a schematic diagram of conventional photolithographic exposure equipment illustrating the feedback relationship between an alignment apparatus and an overlay measurement apparatus in the equipment.
Figure 2:
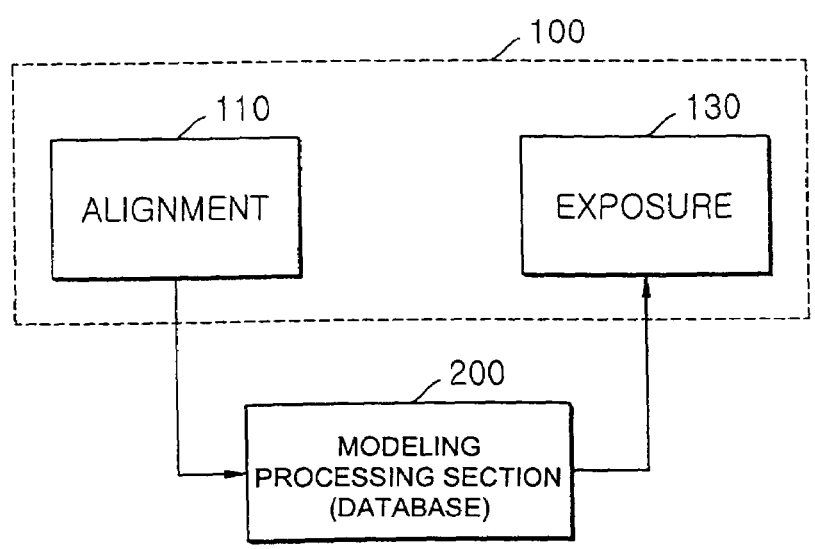
FIG. 2 is a schematic diagram of exposure equipment for use in carrying out an alignment method according to the present invention.

Referring first to FIGS. 2 and 4, a wafer is loaded onto exposure apparatus 100 of photolithographic exposure equipment (operation 410 in FIG. 4). There, the wafer is aligned with a reticle (110 in FIG. 2), the state of alignment of the wafer is measured, and alignment data indicative of the measured state of alignment is produced (operation 420 in FIG. 4). The alignment data is transmitted to a modeling processing section 200. The modelling processing section 200 searches a database for a correction value suited to the alignment data, and transmits the correction value to the exposure apparatus 100. The alignment data is updated with the correction value, and the corrected alignment data is then used by the exposure apparatus 100 to re-align the wafer with the reticle. As a result, the wafer is precisely aligned with the reticle.

More specifically, the modeling processing section 200 has a database of various alignment data types corresponding to various states of alignment of wafers and/or processing conditions of the exposure equipment, and correction values modeled for the types of the alignment data. Accordingly, the alignment process 110 can be performed by measuring the state of alignment between the wafer and the reticle using an alignment mark formed on the wafer (alignment measurement process), searching the database for a correction value corresponding to the alignment measurement data, and applying the correction value to the alignment data.

For example, alignment measurement data is transmitted to the modeling processing section 200, and the modeling processing section 200 classifies the alignment measurement data and searches the database for an alignment data type under which the alignment measurement data falls (operation 430). Also, the modeling processing section 200 searches the database for a correction value modeled for the alignment data type (operation 440). Next, the modeling processing section 200 modifies the alignment data with the correction value to produce corrected alignment data and transmits the corrected alignment data to the exposure equipment. The alignment apparatus 100 completes the alignment of the wafer using the corrected alignment data (operation 450).

Subsequently, the exposure apparatus 100 exposes the aligned wafer to light directed through the reticle (130 in FIG. 2 or operation 460 in FIG. 4). The exposed wafer is unloaded from the exposure apparatus 100 and is then developed.

Accordingly, the overlay measurement process and the feedback process of the prior art can be omitted because the correction value for the alignment process comes from an analysis of various types of alignment data which the alignment process can produce. Nonetheless, an overlay measurement process, i.e. a correction process accounting for the results of the actual exposure process, may be periodically performed.

Figure 3:
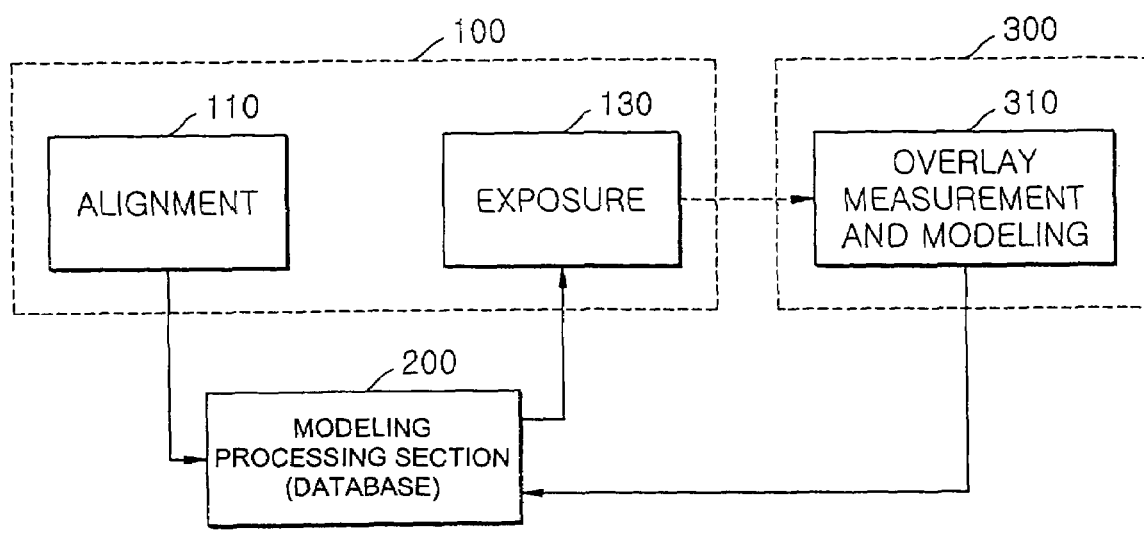
FIG. 3 is a schematic diagram of exposure equipment having an overlay measurement apparatus for periodically verifying a database used in the alignment method shown in FIG. 2.

More specifically, referring to FIG. 3, the photolithographic exposure equipment may also have an overlay measurement apparatus 300. However, in this case and according to the present invention, the overlay measurement apparatus 300 does not perform an overlay measurement and modeling process 310 after every exposure process 130. Rather, the exposed wafers may be sampled periodically. For example, one out of every several tens or hundreds of exposed wafers may be sampled, and an overlay measurement process can be performed for the sampled wafer. The overlay measurement results may be transmitted to the modeling processing section 200 and be used for checking the accuracy of the database and for correcting the database if necessary. Accordingly, the overlay measurement and modeling process is performed less frequently than in the prior art.

As should be clear from the description above, alignment data is classified, correction values are calculated based on the classes of alignment data (types of alignment data), and the correction values are stored in a database before the wafer alignment process. Therefore, the wafers can be aligned for the exposure process using only the alignment measurement and correction process 110.

FIG. 5 shows a method of constructing a database of such alignment data types and correction values.

First, alignment data is collected for various samples (operation 510) that differ according to type of wafer, type of alignment mark and type of exposure apparatus in which they are loaded. The alignment data may be collected according to a global alignment method in which only some of the fields are aligned.

For example, positions are assigned to central, top, bottom, left and right portions of a wafer, and a state of alignment is measured at each of the five designated positions. Moreover, various characteristics of the overlaying of images on a wafer can be determined from analyzing overlay measurement data collected at the designated positions during the same time the alignment data is collected. For example, a shift in the image in an X-axis direction and in a Y-axis direction, an enlargement or reduction of the image, and a rotation of the image in the plane of the wafer may be considered as characteristics of the image overlay. Accordingly, overlay measurement data is also collected at the designated positions (operation 520). The overlay measurement data is used to calculate, through a known modelling method, values for correcting the alignment data.

After the alignment data and the related overlay measurement data are collected (operations 510 and 520), the alignment data is classified (operation 530). The overlay measurement data associated with the classified alignment data is analyzed, and correction values suitable for the alignment data types are calculated using a known modeling method (operation 540). In particular, this modeling method can be carried out using simulations, the techniques of which are themselves well known per se.

Correction value data correlated to the alignment data is stored in a database (operation 550). As mentioned above, the database may be stored in a section 200 of a processor. That is, it has been described up to now that correction values are pre-stored in a database, and a correction value suitable for correcting the alignment data can be selected by searching the database for one that is correlated to the alignment data collected just prior to the exposure process.

Alternatively, though, as described above, the database may be made up of alignment data classified by type of sample and overlay data associated with the alignment data. In this case, the processing section 200 may search the database for a data type under which the collected alignment data falls, then search the database for overlay data associated with the data type that was found, and calculate a correction value from the overlay data that was found. Then the alignment of the wafer may be finalized using the alignment data modified with the correction value that was calculated according to this process.

In general then, according to the method of the present invention, a wafer is loaded onto exposure apparatus. At this time, a preliminary state of alignment between the wafer and a reticle of the exposure apparatus is measured, alignment data indicative of the measured state of alignment is produced, and the alignment data is transmitted to the modeling processing section of the photolithographic equipment. The modeling processing section searches its database for an alignment data type under which the alignment data falls. Subsequently, a correction value correlated to the alignment data type may be extracted from the database, or may be calculated from overlay data (associated with the alignment data type) stored in the database. The correction value is transmitted to the alignment apparatus of the exposure equipment and is used to correct the alignment data that the apparatus uses to align the wafer with the reticle. As a result, the alignment of the wafer is corrected.

Accordingly, alignment correction can be performed in the exposure apparatus through a feedforward method (not a feedback method). In addition, an overlay measurement apparatus 300 may be used only for periodically confirming the accuracy of the database and correcting the database when necessary. Thus, the inventive wafer alignment method minimizes the time required for the photolithography process, thereby contributing to an increase in the productivity of the semiconductor device manufacturing process.

Finally, although the present invention has been particularly shown and described with reference to the preferred embodiments thereof, various changes in form and details may be made thereto without departing from the true spirit and scope of the present invention as defined by the following claims.

What is claimed is:

1. A method of aligning a wafer with a reticle in photolithographic exposure equipment, comprising:
    loading a wafer onto an exposure apparatus in which the reticle is supported;
    aligning the wafer with the reticle in the exposure apparatus, measuring a state of alignment between the wafer and the reticle, and producing alignment data representative of the measured state of alignment between the wafer and the reticle;
    using the alignment data to search a database and select from the database an alignment data type under which the alignment data falls;
    searching the database for overlay data associated with the selected alignment data type, the overlay data being characteristic of the overlaying of images on region of a wafer which has been exposed sequentially in the exposure apparatus;
    using the overlay data to obtain a correction value suited to the alignment data type;
    applying the correction value to the alignment data to produce updated alignment data;
    correcting the alignment of the wafer with the reticle using the updated alignment data; and
    subsequently exposing the aligned wafer to light directed through the reticle.

2. The method of claim 1, and further comprising constructing the database by:
    collecting alignment data for various samples, the collected alignment data being representative of states of alignment between a wafer and a reticle for the samples;
    collecting the overlay data along with the alignment data for each of the samples, and
    classifying the collected alignment data into a plurality of alignment data types, whereby overlay data is associated with each of the alignment data types.

3. The method of claim 2, wherein the constructing of the database also comprises calculating correction values from the overlay data, and the using of the overlay data to obtain a correction value suited to the alignment data type comprises extracting from the database the correction value calculated from the overlay data associated with the alignment data type.

4. The method of claim 1, and further comprising verifying the data of the database periodically through an overlay measurement process performed on a wafer that has undergone an exposure process in the photolithographic equipment.

5. A method of aligning a wafer with a reticle in photolithographic exposure equipment, comprising:
    loading a wafer onto an exposure apparatus in which the reticle is supported;
    aligning the wafer with the reticle in the exposure apparatus, measuring a state of alignment between the wafer and the reticle, and producing alignment data representative of the measured state of alignment between the wafer and the reticle;
    transmitting the alignment data to a processing section in which a database is stored, the database including a plurality of alignment data types;
    using the alignment data to search the database and select from the database an alignment data type under which the alignment data falls;
    obtaining a correction value suited to the alignment data type selected by searching the database;
    using the correction value to correct the alignment of the wafer with the reticle; and
    subsequently exposing the aligned wafer to light directed through the reticle.

6. The method of claim 5, wherein the database also includes correction values modeled for the alignment data types, and said obtaining of the correction value comprises selecting the correction value modeled for the alignment data type selected from the database.

7. The method of claim 5, and further comprising constructing the database by:
    collecting alignment data for various samples, the collected alignment data being representative of states of alignment between a wafer and a reticle for the samples;
    collecting overlay data along with the alignment data for each of the samples, and for each of the samples the overlay data being characteristic of the overlaying of images on the wafer when the wafer is exposed in the exposure apparatus while in the state of alignment used in the collecting of the alignment data for the sample, and
    classifying the collected alignment data into a plurality of alignment data types, whereby collected overlay data is associated with each of the alignment data types.

8. The method of claim 7, wherein the constructing of the database also comprises calculating correction values from the overlay data, and the obtaining of a correction value comprises extracting from the database the correction value calculated from the overlay data associated with the alignment data type uncovered by searching the database.

9. The method of claim 7, and further comprising verifying the data of the database periodically through an overlay measurement process performed on a wafer that has undergone an exposure process in the photolithographic equipment.

* * * * *